United States Patent [19]

Toda et al.

[11] Patent Number: 5,433,170
[45] Date of Patent: Jul. 18, 1995

[54] METAL-ORGANIC CHEMICAL VAPOR-PHASE DEPOSITION PROCESS FOR FABRICATING LIGHT-EMITTING DEVICES

[75] Inventors: Atsushi Toda; Takeharu Asano, both of Kanagawa, Japan

[73] Assignee: Sony Corporation, Tokyo, Japan

[21] Appl. No.: 336,052

[22] Filed: Nov. 4, 1994

[30] Foreign Application Priority Data

Nov. 26, 1993 [JP] Japan .................... 5-321100

[51] Int. Cl.$^6$ ............................ H01L 21/20
[52] U.S. Cl. ...................... 117/103; 117/104; 117/105; 437/105; 437/107; 437/129; 437/133
[58] Field of Search ............. 117/103, 104, 105; 148/DIG. 64; 437/105, 107, 129, 133

[56] References Cited

U.S. PATENT DOCUMENTS 4,881,979 11/1989 Lewis ............................ 437/5
5,311,533 5/1994 Stutius et al. .................. 372/45

*Primary Examiner*—R. Bruce Breneman
*Assistant Examiner*—Ramamohan Rao Paladugu
*Attorney, Agent, or Firm*—Hill, Steadman & Simpson

[57] ABSTRACT

A metal-organic chemical vapor-phase deposition process for fabricating a layer of a Group II-VI compound semiconductor using an organometallic compound based on bis(cyclopentadienyl)magnesium having a vapor pressure in the range of from $1.3 \times 10$ Pa to $1.3 \times 10^2$ Pa at a temperature of 330° K. The present invention also provides a light-emitting device which is fabricated by means of the metal-organic vapor-phase deposition process above. The process according to the present invention provides a magnesium-containing compound semiconductor layer having an accurately controlled composition, and it readily enables the fabrication of a compound semiconductor layer having a grated structure.

20 Claims, 4 Drawing Sheets

X-ray rocking curve

METAL-ORGANIC CHEMICAL VAPOR-PHASE DEPOSITION PROCESS FOR FABRICATING LIGHT-EMITTING DEVICES

BACKGROUND OF THE INVENTION

The present invention relates to a metal-organic chemical vapor deposition (referred to hereinafter as "MOCVD") process for forming a layer of a compound semiconductor comprising elements belonging to Group II and Group VI of periodic table (referred to simply hereinafter as a "Group II–VI compound semiconductor"), and to a process for fabricating light-emitting devices such as semiconductor lasers and light-emitting diodes (LEDs) by means of MOCVD process.

The Group II–VI compound semiconductors, particularly ZnMgSSe compound semiconductors that are believed to be the key material, are now actively studied as promising crystalline materials for the advanced short-wave semiconductor lasers. Because ZnMgSSe compound semiconductors have a large energy band gap and also a smaller index of refraction as compared with that of ZnSSe, they are suitable for use in the clad layers of blue-emitting semiconductor lasers.

A layer of a Group II–VI compound semiconductor is fabricated by depositing the Group II–VI compound semiconductor layer on a gallium arsenide (GaAs) substrate by means of molecular beam epitaxy (MBE). An MBE process comprises heating each of the starting materials charged into molecular beam sources (e.g, Knudsen cells) to generate molecular beams, and irradiating the thus obtained molecular beams to the substrate to form a layer of the compound semiconductor.

However, in case of vaporizing sulfur, i.e., one of the materials for forming a ZnMgSSe compound semiconductor, by means of MBE, the temperature control of the molecular beam source tend to be unstable because the beam sources containing therein sulfur or selenium are heated at such a low temperature of about 200° C. or lower. This makes it difficult to control the composition of the compound semiconductor layer. Particularly in case of fabricating a semiconductor laser, the fluctuation in the composition of the compound semiconductor layer not only impairs the light-emitting characteristics of the semiconductor layer, but also makes it impossible to obtain a laser which emits light as designed.

A compound semiconductor layer can be otherwise fabricated by MOCVD process. In MOCVD process, the composition of the compound semiconductor layer is controlled by varying the flow rate of the gaseous starting materials. Thus, the composition of the compound semiconductor layer can be controlled with higher accuracy. Moreover, a compound layer with a grated structure, which is almost impossible to form by an MBE process, can be easily fabricated by controlling the flow rate of the gaseous material constituting the compound semiconductor layer.

In an MOCVD process, bis(cyclopentadienyl)magnesium [Mg(C$_5$H$_5$)$_2$, referred to simply as "(Cp)$_2$Mg"] has been used conventionally as the organometallic material for supplying magnesium. Referring to FIG. 8, it can be seen that the vapor pressure of (Cp)$_2$Mg is low. More specifically, the vapor pressure of (Cp)$_2$Mg in the temperature range of 370° K. or lower for an ordinary thermostatic cell is found to be $1\times10^{-3}$ Torr (0.133 Pa) or lower. Thus, although (Cp)$_2$Mg can be used favorably as a dopant, it is not suitable for use as a gaseous material for growing the base crystal. In contrast to (Cp)$_2$Mg, dimethylzinc (DMZn) and dimethylselenium (DMSe) can be readily used as the gaseous material for depositing the base crystal because they yield a vapor pressure in the range of from several tens to several hundreds of Torr.

Thus, as mentioned in the foregoing, although there is a known process for fabricating a ZnSe compound semiconductor layer by an MOCVD process, a technique for growing crystals of a ZnMgSSe compound semiconductor on a substrate by means of MOCVD is yet to be developed.

SUMMARY OF THE INVENTION

As mentioned in the foregoing, a first object of the present invention is to provide an MOCVD process for fabricating a compound semiconductor layer containing magnesium. A second object of the present invention is to provide an MOCVD process which easily enables the fabrication of a compound semiconductor layer having a grated structure. A further other object of the present invention is to provide a novel process for fabricating a light-emitting device such as a semiconductor laser and an LED.

The first object of the present invention can be accomplished in one aspect by a first embodiment of the present invention which provides an MOCVD process comprising depositing a layer of a Group II–VI compound semiconductor using an organometallic compound based on bis(cyclopentadienyl)magnesium having a vapor pressure in the range of from $1.3\times10$ Pa (0.1 Torr) to $1.3\times10^2$ Pa (1.0 Torr) at a temperature of 330° K.

In the MOCVD process according to the first embodiment of the present invention, bis(methylcyclopentadienyl)magnesium [Mg(CH$_3$C$_5$H$_4$)$_2$] or bis(isopropylcyclopentadienyl)magnesium [Mg(iC$_3$H$_7$C$_5$H$_4$)$_2$] can be used as the organometallic compound.

Preferably in the process according to the present invention, the layer of the Group II–VI compound semiconductor is grown in the temperature range of from 400° to 600° C. Furthermore, the gaseous material containing an element belonging to Group VI of periodic table is supplied at a quantity ratio of from 2 to 50 with respect to the gaseous material containing an element belonging to Group II of periodic table. Furthermore preferred is to maintain the organometallic compound at a temperature range not lower than the melting point but not higher than the boiling point thereof. In this manner, the organometallic compound based on bis(cyclopentadienyl)magnesium can be smoothly vaporized.

In the MOCVD process according to the first embodiment of the present invention, the layer of the Group II–VI compound semiconductor can be formed from ZnMgSSe. Furthermore, the layer of the Group II–VI compound semiconductor may have a heterojunction at the phase boundary between Zn$_{1-x}$Mg$_x$SSe and Zn$_{1-y}$Mg$_y$SSe, where X being different from Y.

An object of the present invention can be accomplished in another aspect according to a second embodiment of the present invention, which provides an MOCVD process comprising fabricating a layer of a quaternary mixed crystal compound semiconductor containing two kinds of elements belonging to Group II of periodic table and two kinds of elements belonging to Group IV of periodic table, characterized in that the composition of the compound semiconductor layer is varied by changing the gas flow ratio of one of the two kinds of gaseous materials containing the Group VI elements while maintaining the gas flow rate of the two kinds of gaseous materials containing the Group II elements to a constant value. Otherwise, there is provided an MOCVD process comprising fabricating a layer of a quaternary mixed crystal compound semiconductor comprising two kinds of elements belonging to Group II of periodic table and two kinds of elements belonging to Group IV of periodic table, characterized in that the composition of the compound semiconductor layer is varied by changing the gas flow ratio of one of the two kinds of gaseous materials containing the Group II elements while maintaining the gas flow rate of the two kinds of gaseous materials containing the Group VI elements at a constant value.

In the MOCVD process according to a second embodiment of the present invention, one of the two kinds of gaseous containing the Group II element may be a gaseous material containing an organometallic compound based on bis(cyclopentadienyl)magnesium having a vapor pressure in the range of from $1.3 \times 10$ Pa to $1.3 \times 10^2$ Pa at a temperature of 330° K. In this case, the organometallic compound based on bis(cyclopentadienyl)magnesiumiseitherbis(methylcyclopentadienyl)magnesium or bis(isopropylcyclopentadienyl)magnesium. The two kinds of elements belonging to Group II of periodic table are zinc and magnesium, and the two kinds of elements belonging to Group VI of periodic table are sulfur and selenium.

The light-emitting device according to the present invention is fabricated by means of MOCVD process described above. The compound semiconductor layer constituting the light-emitting device may have a double heterostructure, a grated structure, or a separate confinement heterostructure (SCH).

As summarized in the foregoing, the MOCVD process according to the present invention comprises using an organometallic compound based on bis(cyclopentadienyl)magnesium having a vapor pressure in the range of from $1.3 \times 10$ Pa to $1.3 \times 10^2$ Pa at a temperature of 330° K. An MOCVD-grown layer of a compound semiconductor containing magnesium can be obtained by using an organometallic compound having such a high vapor pressure. Furthermore, a compound semiconductor layer of a quaternary mixed crystal with accurately controlled composition can be readily obtained by controlling the supply rate of one of the four gaseous materials.

DESCRIPTION OF THE PREFERRED EMBODIMENTS

The present invention is described in further detail below referring to the preferred embodiments according to the present invention. It should be understood, however, that the present invention is not to be construed as being limited to the examples below.

Example 1

The present example refers to an MOCVD process according to a first embodiment of the present invention. In the present example, bis(methylcyclopentadienyl)magnesium [Mg(CH$_3$C$_5$H$_4$)$_2$; which may sometimes be simply referred to as "(MeCp)$_2$Mg"] is used as the organometallic compound based on bis(cyclopentadienyl)magnesium. The Group II-VI compound semiconductor layer comprises ZnMgSSe. In the present example, the change of magnesium content in ZnMgSSe with changing supply rate of gaseous (MeCp)$_2$Mg is studied.

Thus, layers of compound semiconductor comprising $Zn_{1-x}Mg_xSSe$ was crystal grown on a (100) GaAs (gallium arsenide) substrate by means of normal MOCVD while maintaining the deposition temperature at a constant value of 480° C. The supply rate of gaseous (MeCp)$_2$Mg was varied up to $1.6 \times 10^{-7}$ mol/min while setting the supply rate of the other gaseous materials and the hydrogen (H$_2$) carrier gas to constant values. That is, H$_2$ carrier gas was supplied at a constant rate of 1.3 liter/min, and the gaseous materials, i.e., dimethylzinc (DMZn), dimethylselenium (DMSe), and diethylsulfide (DES), were supplied at a rate of $1.1 \times 10^{-5}$ mol/min, $3.3 \times 10^{-5}$ mol/min, and $8.8 \times 10^{-5}$ mol/min, respectively.

Figure 1:
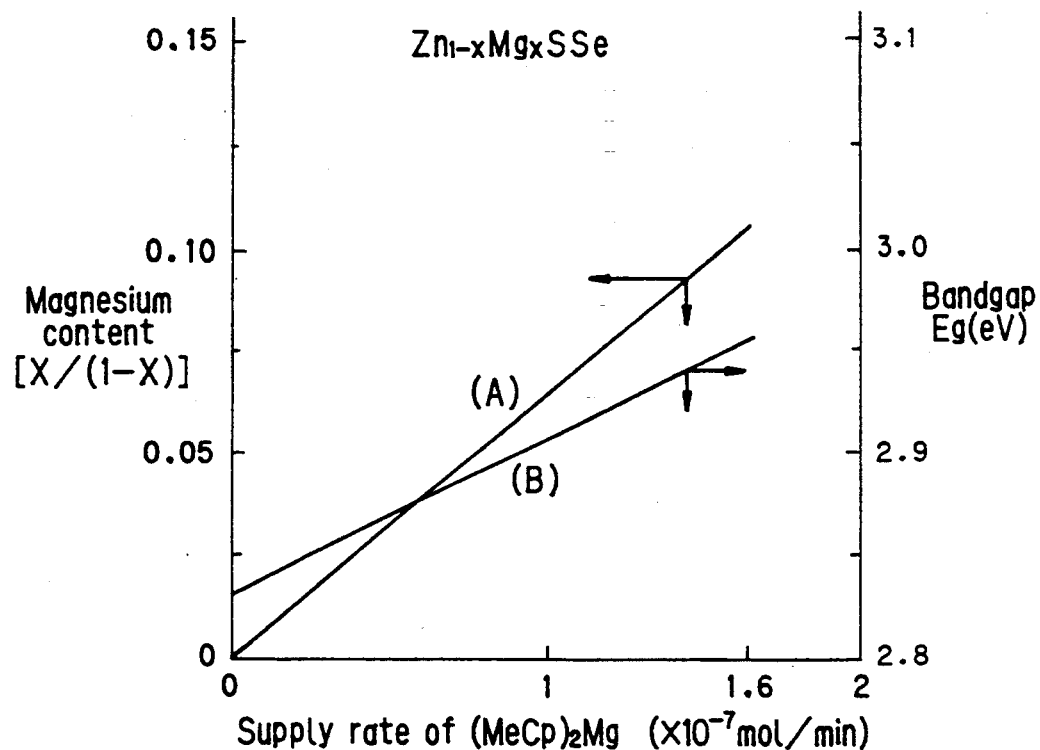
FIG. 1 is a graph which shows the change in magnesium content ratio as expressed by $X(1-X)$ and band gap Eq of the semiconductor layer with changing supply rate of bis(methylcyclopentadienyl)magnesium [(MeCp)$_2$Mg]

The change in magnesium content as expressed by $X/(1-X)$ in $Zn_{1-x}Mg_xSSe$ of the specimens thus obtained with varying supply rate of gaseous (MeCp)$_2$Mg is shown by a straight line marked with "A" in the graph of FIG. 1. The content of magnesium was obtained by means of electron probe microanalysis (EPMA) and was expressed in terms of $X/(1-X)$. In the graph of FIG. 1, the straight line marked with "B" shows the relation between the band gap Eq of the specimens obtained above with changing supply rate of gaseous (MeCp)$_2$Mg. The band gap Eq was obtained by measuring photoluminescence at 77° K.

FIG. 1 clearly reads that both the content of magnesium [$X/(1-X)$] in $Zn_{1-x}Mg_xZZn$ and the band gap Eg increase linearly with increasing supply rate of gaseous (MeCp)$_2$Mg. The results indicate that magnesium is incorporated with excellent controllability into the semiconductor layer to form a quaternary mixed crystal compound semiconductor. It was also found that the process yields favorable reproducibility with the fluctuation in composition falling within a range of 3%.

Figure 2:
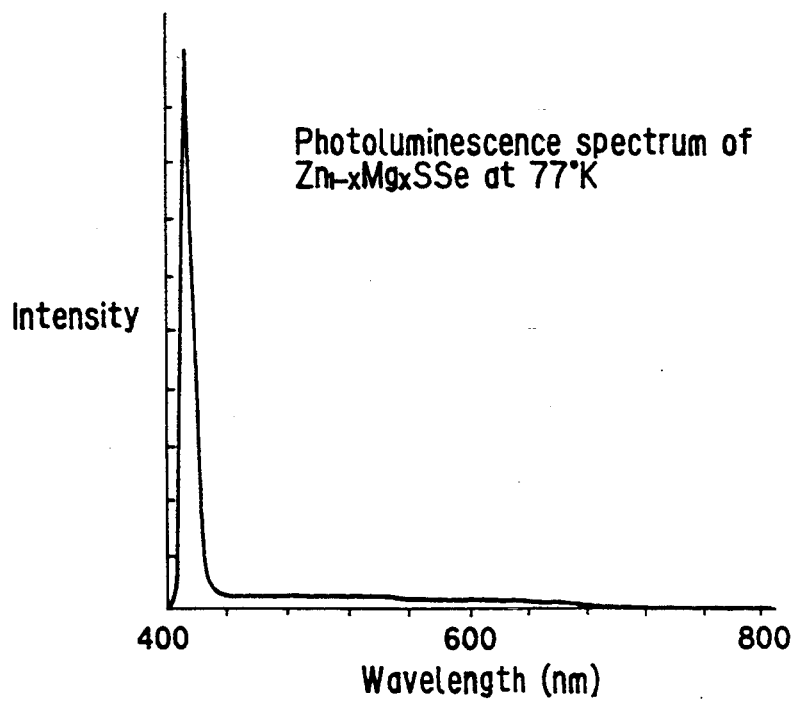
FIG. 2 is a typical photoluminescence spectrum at 77° K. for a $Zn_{1-x}Mg_xSSe$ specimen obtained in a first embodiment according to the present invention.

FIG. 2 shows a typical photoluminescence spectrum measured at 77° K for a $Zn_{1-X}Mg_XSSe$ specimen obtained above. It can be seen that no principal light emission is observed except for those assigned to band edges. In particular, the fact that no light emission from the deeper levels in the longer wavelength side is observed assures the high crystallinity of the compound semiconductor layer.

Figure 3:
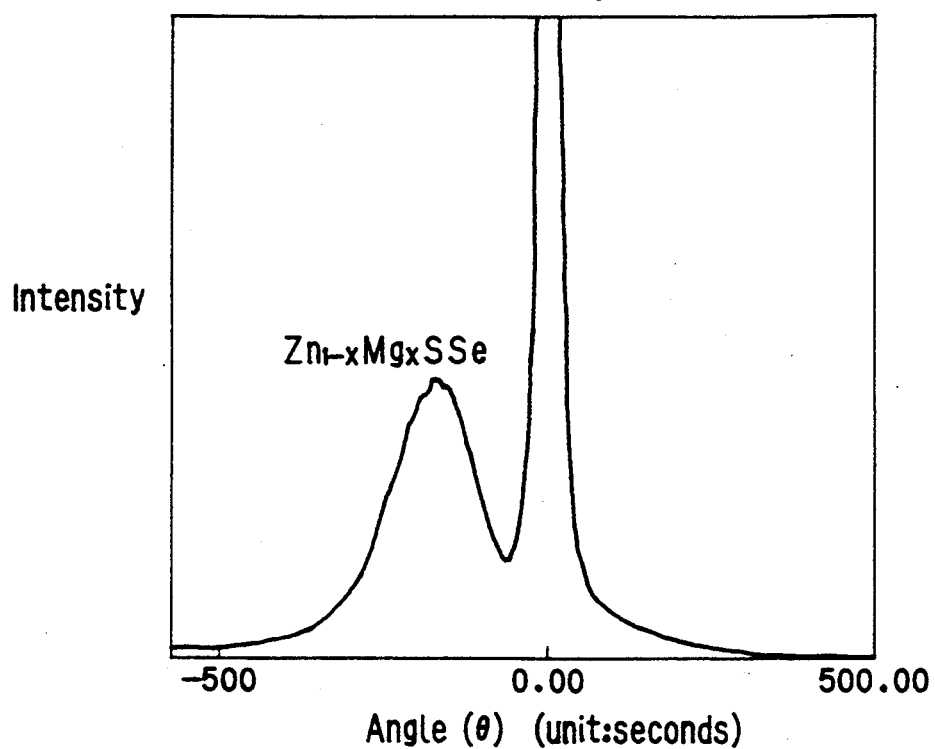
FIG. 3 is an X-ray rocking curve obtained on a $Zn_{1-x}Mg_xSSe$ specimen obtained in a first embodiment according to the present invention.

Referring to FIG. 3, a half band width of about 100 seconds was obtained as a result of taking the X-ray rocking curve on the compound semiconductor. This also confirms that the compound semiconductor layer has a favorable crystallinity. Furthermore, microscopic observation of the compound semiconductor layer revealed a surface having excellent morphology.

The above results show that the MOCVD process according to the present invention provides a compound semiconductor layer comprising ZnMgSSe having less crystal defects and therefore suitable for use in the fabrication of light-emitting devices such as semiconductor lasers.

Additional test results also revealed that the gaseous materials do not undergo pyrolysis at a crystal growth temperature for the Group II-VI compound semiconductor of lower than 400° C. This signifies that a Group II-VI compound semiconductor does not grow on the substrate at a temperature lower than 400° C. Furthermore, it was found by microscopic observation of the surface of the compound semiconductor layer that the surface morphology tend to be impaired with increasing temperature over 600° C. during the crystal growth.

It was also found by additional tests that the gaseous material containing an element belonging to Group II of periodic table for forming the Group II-VI compound semiconductor layer is preferably supplied at a rate of 2 to 50 times that of the gaseous material containing an element belonging to Group VI of periodic table. When the supply ratio of the gases fall out of this preferred range, the resulting Group II-VI compound semiconductor tend to yield a photoluminescence spectrum at 77° K. having a light emission from a deeper level in a longer wavelength side. This is an evidence of poor crystallinity for the compound semiconductor layer. Moreover, under the microscope, an unfavorable surface morphology is observed for the resulting compound semiconductor layer.

Example 2

The present example refers to an MOCVD process according to a second embodiment of the present invention. In the present example, $(MeCp)_2Mg$ is used as the organometallic compound based on bis(cyclopentadienyl)magnesium. The Group II-VI compound semiconductor layer comprises ZnMgSSe. In the present example, the change in composition as expressed in terms of ZnMg in ZnMgSSe with changing supply rate of gaseous DMSe is studied.

Thus, layers of compound semiconductor comprising $Zn_{1-X}Mg_XSSe$ was crystal grown on a (100) GaAs (gallium arsenide) substrate by means of normal MOCVD while maintaining the deposition temperature at a constant value of 480° C. The substrate was previously subjected to thermal etching in a gaseous hydrogen atmosphere at 600° C. for a duration of 10 minutes before effecting the crystal growth of the compound semiconductor. The supply rate of gaseous DMSe was varied from $1.6 \times 10^{-5}$ to $3.3 \times 10^{-5}$ mol/min while setting the supply rate of the other gaseous materials and the hydrogen ($H_2$) carrier gas to constant values. That is, $H_2$ carrier gas was supplied at a constant rate of 1.3 liter/min, and the gaseous materials, i.e., dimethylzinc (DMZn), $(MeCp)_2Mg$, and diethylsulfide (DES), were supplied at a rate of $1.1 \times 10^{-5}$ mol/min, $1.2 \times 10^{-7}$ mol/min, and $8.8 \times 10^{-5}$ mol/min, respectively.

Figure 4:
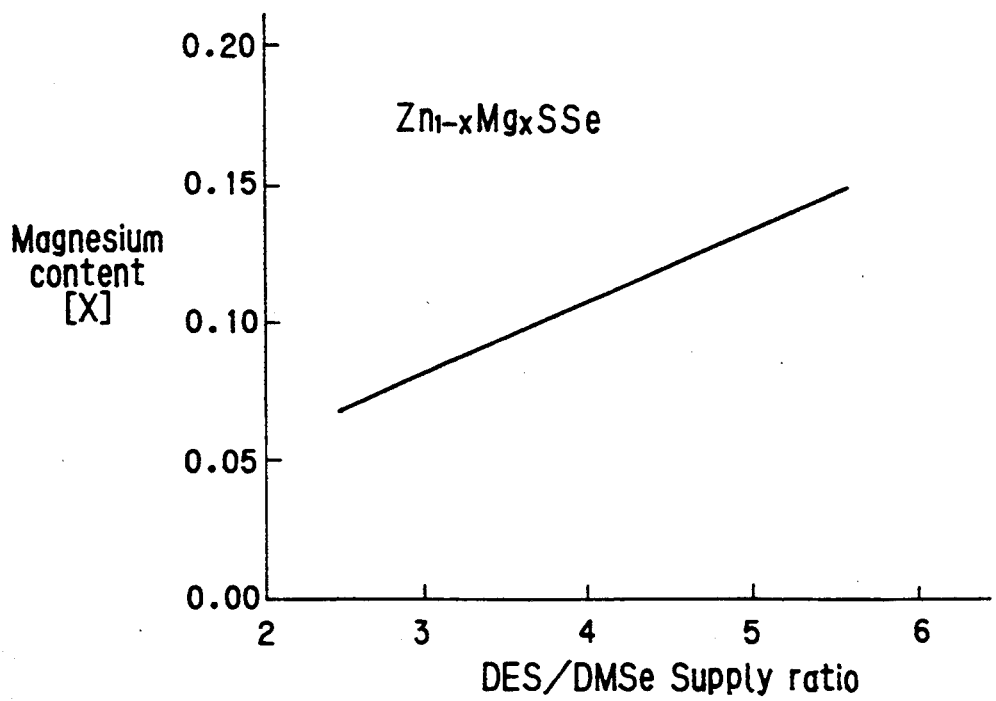
FIG. 4 is a graph which shows the change in magnesium content of the semiconductor layer with changing supply ratio of diethylsulfide (DES) to dimethylselenium (DMSe) [DESDMSe]

The change in magnesium content X with varying supply ratio of DES and DMSe (DES/DMSe) as obtained from the specimens prepared above is shown in the graph of FIG. 4. The content of magnesium E was obtained by means of electron probe microanalysis (EPMA). FIG. 4 clearly reads that the magnesium content X increases linearly with increasing the supply ratio DES/DMSe. It can be seen therefore that the magnesium content in the semiconductor layer can be controlled by adjusting the supply ratio DES/DMSe. Thus, a compound semiconductor layer with a grated structure can be readily obtained.

Example 3

The present example refers to an MOCVD process according to a first embodiment of the present invention and to a process for fabricating a light-emitting device comprising a semiconductor laser using the MOCVD process. In the present example, $(MeCp)_2Mg$ is used as the organometallic compound based on bis(cyclopentadienyl)magnesium. The Group II-VI compound semiconductor layer for the clad layer of the semiconductor laser comprises ZnMgSSe. In the present example, a double heterostructure compound semiconductor layer constitutes the light-emitting device. An MOCVD process and a process for fabricating a semiconductor laser according to a third embodiment of the present invention is described below.

Step 300

An n-type (100) gallium arsenide (GaAs) substrate 10 placed inside an MOCVD apparatus was subjected to thermal etching in gaseous hydrogen at 600° C. for a duration of 10 minutes to clean the surface thereof. A first clad layer 11 comprising an n-type $Zn_{0.90}Mg_{0.10}SSe$ was deposited to a thickness of 1.5 µm on the thus cleaned surface of the GaAs substrate 10 by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $1.7 \times 10^{-7}$ mol/min, $8.8 \times 10^{-5}$ mol/min, and $3.3 \times 10^{-5}$ mol/min, respectively, and supplying $C^2H_5I$ as the dopant at a rate of $1.0 \times 10^{-6}$ mol/min while flowing gaseous hydrogen as the carrier gas at a rate of 1.3 liter/min. It can be seen that the ratio (VI/II ratio) of the supply rate of the gaseous materials containing elements belonging to Group VI [DES+DMSe] to that of the gaseous materials containing elements belonging to Group II [DMZn+$(MeCp)_2Mg$] is 11.

In the following process steps, the thermostatic cell charged therein $(MeCp)_2Mg$ and placed inside the MOCVD apparatus was maintained in the temperature range of from 30° to 56° C., i.e., in a temperature range not lower than the melting point of $(MeCp)_2Mg$ but not higher than the boiling point thereof. Thus, for instance, the temperature of the thermostatic cell in this case was held at 45° C. Gaseous hydrogen was introduced as a bubbling gas into the thermostatic cell charged therein $(MeCp)_2Mg$ in the form of a liquid to transport and supply gaseous $(MeCp)_2Mg$ into the MOCVD apparatus.

Step 310

An active layer 12 comprising $Zn_{0.98}Mg_{0.02}SSe$ was deposited on the first clad layer 11 to a thickness of 0.07 $\mu m$ by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $3.0 \times 10^{-8}$ mol/min, $8.8 \times 10^{-5}$ mol/min, and $3.3 \times 10^{-5}$ mol/min, respectively, while flowing gaseous hydrogen as the carrier gas at a rate of 1.3 liter/min. It can be seen that the ratio (VIII ratio) of the supply rate of the gaseous materials containing elements belonging to Group VI [DES+DMSe] to that of the gaseous materials containing elements belonging to Group II [DMZn+$(MeCp)_2Mg$] is 11.

Step 320

A second clad layer 13 comprising a p-type $Zn_{0.90}Mg_{0.10}SSe$ was deposited to a thickness of 1.5 $\mu m$ on the active layer 12 by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $1.7 \times 10^{-7}$ mol/min, $8.8 \times 10^{-5}$ mol/min, and $3.3 \times 10^{-5}$ mol/min, respectively, and supplying t-$BNH^2$ (tert-$C_4H_9NH_2$) as the dopant at a rate of $1.0 \times 10^{-3}$ mol/min while flowing gaseous hydrogen as the carrier gas at a rate of 1.3 liter/min. It can be seen that the ratio (VIII ratio) of the supply rate of the gaseous materials containing elements belonging to Group VI [DES+DMSe] to that of the gaseous materials containing elements belonging to Group II [DMZn+$(MeCp)_2Mg$] is 11.

Thus is formed a heterojunction between a layer of $Zn_{1-X}Mg_XSSe$ and a layer of $Zn_{1-Y}Mg_YSSe$ (where, X is 0.10 and Y is 0.02) corresponding to the first clad layer 11 and the active layer 12 as well as to the active layer 12 and the second clad layer 13.

Step 330

A cap 14 comprising a p-type ZnSe was deposited to a thickness of 0.5 $\mu m$ on the second clad layer 13 by means of MOCVD process at a deposition temperature of 480° C. by flowing the gaseous materials DMZn and DMSe at a rate of $1.1 \times 10^{-5}$ mol/min and $6.6 \times 10^{-5}$ mol/min, respectively, and supplying t-$BNH^2$ as the dopant at a rate of $1.0 \times 10^{-3}$ mol/min while flowing gaseous hydrogen as the carrier gas at a rate of 1.3 liter/min.

Step 340

Figure 5:
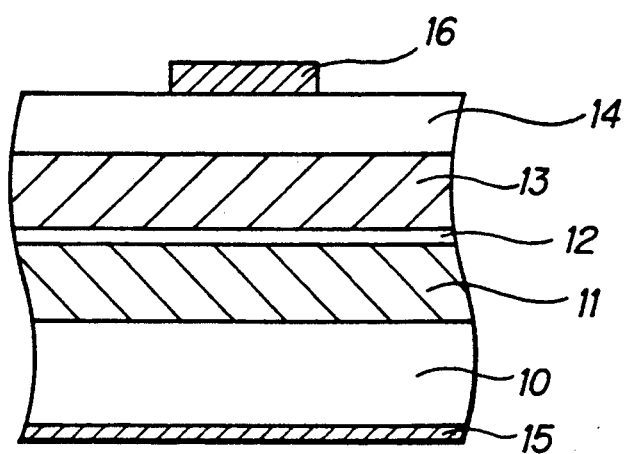
FIG. 5 is a schematically drawn cross section view of a part of the semiconductor laser according to a third embodiment of the present invention.

An n-type AuGe/Ni/Au electrode 15 was formed on the bottom plane of the GaAs substrate 10, and a p-type Pd/Pt/Au electrode 16 was formed on the cap 14. By annealing the resulting structure at 400° C. for a duration of 1 minute, complete electrodes were established. Thus is obtained a light-emitting device comprising a double heterostructure semiconductor laser as illustrated partially in the schematically drawn cross section view of FIG. 5.

Although a ZnMgSSe compound semiconductor is used for the fabrication of the active layer 12 in the present example, other compound semiconductors such as ZnCdSe, ZnSe, and ZnSSe can be used as well for the active layer.

Example 4

The present example refers to an MOCVD process according to a first embodiment of the present invention and to a process for fabricating a light-emitting device comprising a semiconductor laser using the MOCVD process. In the present example, $(MeCp)_2Mg$ is used as the organometallic compound based on bis(cyclopentadienyl)magnesium. The Group II–VI compound semiconductor layer for the clad layer of the semiconductor laser comprises ZnMgSSe. In the present example, a separate confinement heterostructure (SCH) compound semiconductor layer constitutes the light-emitting device. An MOCVD process and a process for fabricating a semiconductor laser according to a fourth embodiment of the present invention is described below.

Step 400

An n-type (100) gallium arsenide (GaAs) substrate 10 placed inside an MOCVD apparatus was subjected to thermal etching in gaseous hydrogen at 600° C. for a duration of 10 minutes to clean the surface thereof. A first clad layer 11 comprising an n-type $Zn_{0.90}Mg_{0.10}SSe$ was deposited to a thickness of 1.5 $\mu m$ on the thus cleaned surface of the GaAs substrate 10 by means of MOCVD in the same manner as in the step for depositing the first active layer of Example 3.

Step 410

A first optical guide layer 20 comprising an n-type $Zn_{0.98}Mg_{0.02}SSe$ was deposited on the first clad layer 11 to a thickness of 0.1 $\mu m$ by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $3.0 \times 10^{-8}$ mol/min, $8.8 \times 10^{-5}$ mol/min, and $3.3 \times 10^{-5}$ mol/min, respectively, and supplying $C_2H_5I$ as the dopant at a rate of $1.0 \times 10^{-6}$ mol/min while flowing gaseous hydrogen as the carrier gas at a rate of 1.3 liter/min. It can be seen that the ratio (VIII ratio) of the supply rate of the gaseous materials containing elements belonging to Group VI [DES+DMSe] to that of the gaseous materials containing elements belonging to Group II [DMZn+$(MeCp)_2Mg$] is 11.

Step 420

A ZnCdSe active layer 12 was deposited at a thickness of 0.01 $\mu m$ on the first optical guide layer 20 by means of MOCVD at a crystal growth temperature of 480° C. by flowing the gaseous materials DMCd, DMZn, and DMSe at a rate of $1.0 \times 10^{-5}$ mol/min, $1.1 \times 10^{-5}$ mol/min, and $1.2 \times 10^{-4}$ mol/min, respectively, while flowing gaseous hydrogen as the carrier gas at a rate of 1.3 liter/min.

Step 430

A second optical guide layer 21 comprising a p-type $Zn_{0.98}Mg_{0.02}SSe$ was deposited to a thickness of 0.1 $\mu m$ on the active layer 12 by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $3.0 \times 10^{-8}$ mol/min, $8.8 \times 10^{-5}$ mol/min, and $3.3 \times 10^{-5}$ mol/min, respectively, and supplying t-$BNH^2$ as the dopant at a rate of $1.0 \times 10^{-3}$ mol/min while flowing gaseous hydrogen as the carrier gas at a rate of 1.3 liter/min. It can be seen that the ratio (VI/II ratio) of the supply rate of the gaseous materials containing elements belonging to Group VI [DES+DMSe] to that of the gaseous materials containing elements belonging to Group II [DMZn+$(MeCp)_2Mg$] is 11.

Step 440

A second clad layer 13 comprising a p-type $Zn_{0.90}Mg_{0.10}SSe$ was deposited to a thickness of 1.5 $\mu m$ on the active layer 12 by means of MOCVD in the same manner as in the step of depositing the second clad layer in Example 3.

Thus is formed a heterojuunction between a layer of $Zn_{1-X}Mg_XSSe$ and a layer of $Zn_{1-Y}Mg_YSSe$ (where, X is 0.10 and Y is 0.02) corresponding to the first clad layer 11 and the first optical guide layer 20 as well as to the second optical guide layer 21 and the second clad layer 13.

Step 450

A cap 14 comprising a p-type ZnSe was deposited to a thickness of 0.5 μm on the second clad layer 13 by means of MOCVD under the same conditions as those employed in the step of forming the cap as in Example 3.

Step 460

Figure 6:
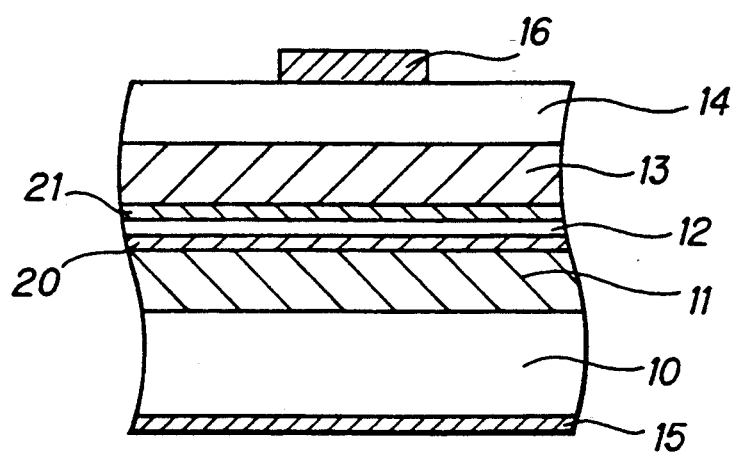
FIG. 6 is a schematically drawn cross section view of a part of the semiconductor laser according to a fourth embodiment of the present invention.

An n-type electrode 15 was formed on the bottom plane of the GaAs substrate 10, and a p-type electrode 16 was formed on the cap 14 in the same manner as in Example 3. thus is fabricated a light-emitting device comprising a semiconductor laser having an SCH structure as shown partially in the schematically drawn cross section view of FIG. 6.

Although a ZnMgSSe compound semiconductor was used for the fabrication of the active layer 12 in the present example, other compound semiconductors such as ZnSeTe can be used as well. Furthermore, instead of fabricating the first clad layer 20 and the second clad layer 21 using a ZnMgSSe compound semiconductor, they can be constructed using other compound semiconductors such as ZnSe and ZnSSe.

Example 5

The present example refers to an MOCVD process according to first and second embodiments of the present invention, and to a process for fabricating a light-emitting device comprising a semiconductor laser using the MOCVD process. In the present example, $(MeCp)_2Mg$ is used as the organometallic compound based on bis(cyclopentadienyl)magnesium. The Group II–VI compound semiconductor layer for the clad layer of the semiconductor laser comprises ZnMgSSe. In the present example, a compound semiconductor layer having a grated structure constitutes the optical guide layer of the light-emitting device. The first and the second clad layers are formed by the MOCVD process according to the first embodiment, and the first and the second optical guide layers having the grated structure are formed by the MOCVD process according to the second embodiment. The MOCVD process and a process for fabricating a semiconductor laser according to a fifth embodiment of the present invention is described below.

Step 500

An n-type (100) gallium arsenide (GaAs) substrate 10 placed inside an MOCVD apparatus was subjected to thermal etching in gaseous hydrogen at 600° C. for a duration of 10 minutes to clean the surface thereof. A first clad layer 11 comprising an n-type $Zn_{0.90}Mg_{0.10}SSe$ was deposited to a thickness of 1.5 μm on the thus cleaned surface of the GaAs substrate 10 by means of MOCVD in the same manner as in the step for depositing the first active layer of Example 3.

Step 510

A first optical guide layer 30 was deposited on the first clad layer 11 to a thickness of 0.1 μm by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-5}$ mol/min, $3.0 \times 10^{-8}$ mol/min, $8.8 \times 10^{-5}$ mol/min, and in a range of from $3.3 \times 10^{-5}$ to $7.0 \times 10^{-5}$ mol/min, respectively, and supplying $C_2H_5I$ as the dopant at a rate of $1.0 \times 10^{-6}$ mol/min while flowing gaseous hydrogen as the carrier gas at a rate of 1.3 liter/min. Gaseous DMSe was supplied over 8 minutes while continuously changing the flow rate from $3.3 \times 10^{-5}$ to $7.0 \times 10^{-5}$ mol/min. A first optical guide layer 30 with continuously changing composition from $Zn_{0.98}Mg_{0.02}SSe$ to $Zn_{0.99}Mg_{0.01}SSe$ was thus obtained. Alternatively, the supply rate of DMSe can be changed stepwise. In this manner, a first optical guide layer 30 with a stepwise changing content for zinc and magnesium can be obtained. Otherwise, the supply rate of DES can be changed either continuously or stepwise instead of changing the supply rate of DMSe.

Step 520

A ZnCdSe active layer 12 was deposited at a thickness of 0.01 μm on the first optical guide layer 20 by MOCVD process under the same conditions as those employed in the step for depositing the active layer in Example 4.

Step 530

A second optical guide layer 31 was deposited to a thickness of 0.1 μm on the active layer 12 by means of MOCVD. The MOCVD process was effected at a crystal growth temperature of 480° C. by flowing the gaseous materials DMZn, $(MeCp)_2Mg$, DES, and DMSe at a rate of $1.1 \times 10^{-6}$ mol/min, $3.0 \times 10^{-8}$ mol/min, $8.8 \times 10^{-5}$ mol/min, and in a range of from $7.0 \times 10^{-5}$ to $3.3 \times 10^{-5}$ mol/min, respectively, and supplying t-$BNH^2$ as the dopant at a rate of $1.0 \times 10^{-3}$ mol/min while flowing gaseous hydrogen as the carrier gas at a rate of 1.3 liter/min. Gaseous DMSe was supplied over 8 minutes while continuously decreasing the flow rate from $7.0 \times 10^{-5}$ to $3.3 \times 10^{-5}$ mol/min. A second optical guide layer 31 with continuously changing composition from $Zn_{0.99}Mg_{0.01}SSe$ to $Zn_{0.98}Mg_{0.02}SSe$ was thus obtained. Alternatively, the supply rate of DMSe can be changed stepwise. In this manner, a second optical guide layer 31 with a stepwise changing content for zinc and magnesium can be obtained. Otherwise, the supply rate of DES can be changed either continuously or stepwise instead of changing the supply rate of DMSe.

Step 540

A second clad layer 13 comprising a p-type $Zn_{0.90}Mg_{0.10}SSe$ was deposited to a thickness of 1.5 μm on the active layer 12 by means of MOCVD in the same manner as in the step of depositing the second clad layer in Example 3.

Thus is formed a grated structure with a composition gradually changing from $Zn_{1-X}Mg_XSSe$ to $Zn_{1-Y}Mg_YSSe$ (where, X is 0.10 and Y is 0.02), or vice versa, is formed on the first optical guide layer 30 and the second optical guide layer 31.

Step 550

A cap 14 comprising a p-type ZnSe was deposited to a thickness of 0.5 μm on the second clad layer 13 by means of MOCVD under the same conditions as those employed in the step of forming the cap as in Example 3.

Step 560

Figure 7:
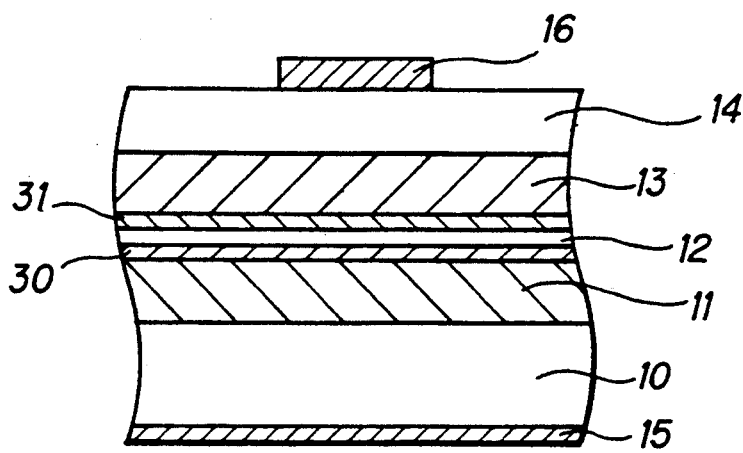
FIG. 7 is a schematically drawn cross section view of a part of the semiconductor laser according to a fifth embodiment of the present invention.
Figure 8:
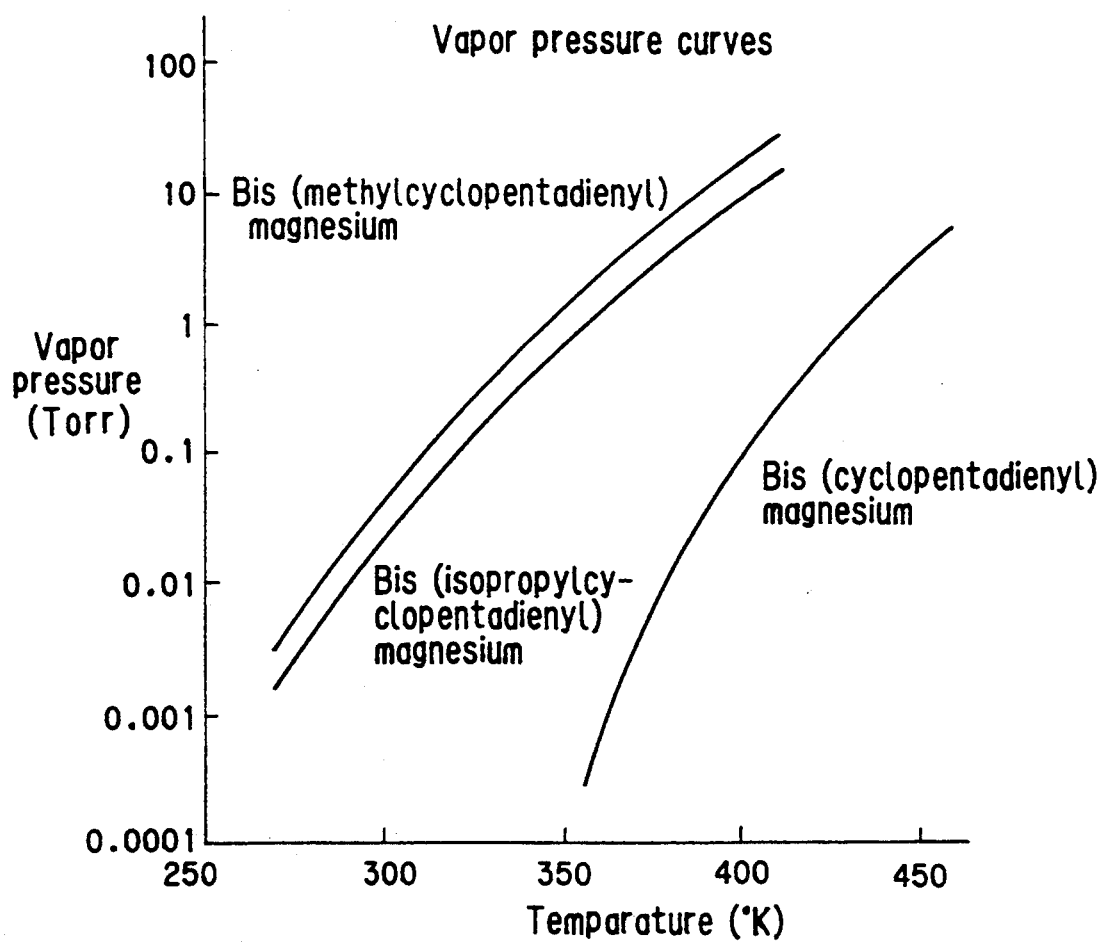
FIG. 8 is a graph showing the change in vapor pressure with temperature of some organometallic compounds based on bis(cyclopentadienyl)magnesium.

An n-type AuGe/Ni/Au electrode 15 was formed on the bottom plane of the GaAs substrate 10, and a p-type Pd/Pt/Au electrode 16 was formed on the cap 14. By annealing the resulting structure at 400° C. for a duration of 1 minute, complete electrodes were established. Thus is obtained a light-emitting device comprising a GRIN-SCH structured semiconductor laser having a grated structure as illustrated in the partially drawn schematic cross section view of FIG. 7.

Although a ZnCdSe compound semiconductor is used for the fabrication of the active layer 12 in the present example, other compound semiconductors such as ZnSeTe can be used as well.

Furthermore, instead of fabricating the first clad layer 30 and the second clad layer 31 having the grated structure by the MOCVD process according to the second embodiment of the present invention as was the case in the present example, the clad layers can be fabricated by the MOCVD process according to the first embodiment of the present invention. In employing the MOCVD process of the first embodiment, the supply rate of the gaseous material is changed either continuously or stepwise. Furthermore, the first clad layer 30 and the second clad layer 31 can be formed from, for instance, a compound semiconductor such as ZnSe and ZnSSe instead of using the MOCVD process according to the present invention.

Thus, the present invention was described in detail referring to preferred embodiments. However, it should be noted that the present invention is not only limited to the examples above. It should be understood that the specific process conditions and compositions described above are provided for exemplification, and it will be apparent to one skilled in the art that various changes and modifications can be made therein without departing from the spirit and scope thereof. For instance, although bis(methylcyclopentadienyl)magnesium is used in the examples above as an organometallic compound based on bis(cyclopentadienyl)magnesium, bis-(isopropylcyclopentadienyl)magnesium can be used under the similar conditions as those in the examples above to fabricate the compound semiconductor layers.

Although specific embodiments were explained by taking a ZnMgSSe compound semiconductor layer as the mixed crystal compound semiconductor layer containing magnesium, the present invention is well applicable to a process using other magnesium-containing mixed crystal compound semiconductors, such as ZnMgTe.

In the examples above, $C_2H_5I$ was utilized as the n-type dopant. However, dopants are not only limited thereto, and other useful dopants include $CH_3I$, n-$C_4H_9I$, and tert-$C_4H_9I$. In addition to t-$BNH_2$ (tert-$C_4H_9NH_2$), p-type dopants include $NH_3$, $CH_3N_3$, and $(CH_3)_2NNH_2$. Moreover, the substrate is not only limited to an n-GaAs substrate, and a p-GaAs substrate can be used as well. In case of using a p-GaAs substrate, the processes described above can be followed by reversing the conductive types of each of the compound semiconductor layers.

Specific explanation was made by taking a semiconductor laser as an example of a light-emitting device in the foregoing Examples 3 to 5. However, light-emitting devices according to the present invention include a light-emitting diode (LED). Thus, an LED whose structure is basically similar to the laser described in Example 3 can be readily fabricated by the MOCVD process according to the present invention. Also included in the light-emitting devices of the present invention are those comprising LEDs emitting RGB (three primaries) or monolithically assembled semiconductor laser, in which an electron beam is ejected from a built-in electron gun to the LEDs or to the semiconductor laser to allow the LED or the laser to emit RGB.

Such light-emitting devices can be fabricated as well by the MOCVD process according to the present invention.

In Example 5, specific explanation was made on an embodiment in which the content of zinc and magnesium is controlled either continuously or stepwise by changing the supply rate of DMSe or DES continuously or stepwise. However, modifications can be made of the process by changing the supply rate of DMZn or $(MeCp)_2Mg$ instead of that of DMSe or DES to change the composition ratio of S and Se either continuously or stepwise. Furthermore, the MOCVD process according to the present invention can be applied to the formation of a compound semiconductor layer having a multiple quantum well structure or a modified multiple quantum well structure.

As described in the foregoing, the present invention provides a magnesium-containing compound semiconductor layer having an accurately controlled composition by MOCVD process. By additionally controlling the supply rate of one of the gaseous materials, the composition of the quaternary mixed crystal compound semiconductor can be easily controlled. Thus, the present invention readily provides a compound semiconductor layer having a grated structure.

While the invention has been described in detail and with reference to specific embodiments thereof, it will be apparent to one skilled in the art that various changes and modifications can be made therein without departing from the spirit and scope thereof.

What is claimed is:

1. A metal-organic chemical vapor deposition process for fabricating a layer of a Group II–VI compound semiconductor using an organometallic compound based on bis(cyclopentadienyl)magnesium selected from the group consisting of bis(methylcyclopentadienyl)magnesium and bis(isopropylcyclopentadienyl)magnesium having a vapor pressure in the range of from $1.3 \times 10$ Pa to $1.3 \times 10^2$ Pa at a temperature of 330° K.

2. A metal-organic chemical vapor-phase deposition process as claimed in claim 1, wherein, the layer of the Group II–VI compound semiconductor is grown at a temperature in the range of from 400° to 600° C.

3. A metal-organic chemical vapor-phase deposition process as claimed in claim 1, wherein, the layer of the Group II–VI compound semiconductor is deposited by supplying a gaseous starting material containing the element belonging to Group VI of periodic table and a gaseous starting material containing the element belonging to Group II at a ratio of the former to the latter of from 2 to 50.

4. A metal-organic chemical vapor-phase deposition process as claimed in claim 1, wherein, the organometallic compound based on bis(cyclopentadienyl)magnesium is vaporized by maintaining said organometallic compound at a temperature not lower than the melting point but at a temperature not higher than the boiling point of said organometallic compound.

5. A metal-organic chemical vapor-phase deposition process as claimed in claim 1, wherein, the layer of the Group II–VI compound semiconductor comprises ZnMgSSe.

6. A metal-organic chemical vapor-phase deposition process as claimed in claim 5, wherein, the layer of the Group II–VI compound semiconductor comprises a heterojunction between $Z_{1-X}Mg_XSSe$ and $Zn_{1-Y}Mg_YSSe$, where X not being equal to Y.

7. A metal-organic chemical vapor deposition process for fabricating a layer of a quaternary mixed crystal compound semiconductor comprising two kinds of elements belonging to Group II of periodic table, wherein at least one of the Group II is selected from the group consisting of bis(methylcyclopentadienyl)magnesium and bis(isopropylcyclopentadienyl)magnesium and two kinds of elements belonging to Group (IV) VI of the periodic table, wherein, the composition of the compound semiconductor layer is varied by changing the gas flow ratio of one of the two kinds of gaseous materials containing the group VI elements while maintaining the gas flow rate of the two kinds of gaseous materials containing the Group II elements to a constant value.

8. A metal-organic chemical vapor deposition process for fabricating a layer of a quaternary mixed crystal compound semiconductor comprising two kinds of elements belonging to Group II of periodic table, wherein at least one of the Group II is selected from the group consisting of bis(methylcyclopentadienyl)magnesium and bis(isopropylcyclopentadienyl)magnesium and two kinds of elements belonging to Group (IV) VI of the periodic table, wherein, the composition of the compound semiconductor layer is varied by changing the gas flow ratio of one of the two kinds of gaseous materials containing the group II elements while maintaining the gas flow rate of the two kinds of gaseous materials containing the Group VI elements to a constant value.

9. A metal-organic chemical vapor-phase deposition process as claimed in claim 7, wherein, one of the two kinds of gaseous materials containing the Group II elements of the periodic table is a gaseous material comprising an organometallic compound based on bis(cyclopentadienyl)magnesium having a vapor pressure of from $1.3 \times 10$ Pa to $1.3 \times 10^2$ Pa at 330° K.

10. A metal-organic chemical vapor-phase deposition process as claimed in claim 8, wherein, one of the two kinds of gaseous materials containing the Group II elements of the periodic table is a gaseous material comprising an organometallic compound based on bis(cyclopentadienyl)magnesium having a vapor pressure of from $1.3 \times 10$ Pa to $1.3 \times 10^2$ Pa at 330° K.

11. A metal-organic chemical vapor-phase deposition process as claimed in claim 9, wherein, the organometallic compound based on bis(cyclopentadienyl)magnesium is bis(methylcyclopentadienyl)magnesium.

12. A metal-organic chemical vapor-phase deposition process as claimed in claim 10, wherein, the organometallic compound based on bis(cyclopentadienyl)magnesium is bis(methylcyclopentadienyl)magnesium.

13. A metal-organic chemical vapor-phase deposition process as claimed in claim 9, wherein, the organometallic compound based on bis(cyclopentadienyl)magnesium is bis(isopropylcyclopentadienyl)magnesium.

14. A metal-organic chemical vapor-phase deposition process as claimed in claim 10, wherein, the organometallic compound based on bis(cyclopentadienyl)magnesium is bis(isopropylcyclopentadienyl)magnesium.

15. A metal-organic chemical vapor-phase deposition process as claimed in claim 9, wherein, the two kinds of elements belonging to Group II of periodic table are zinc and magnesium, and the two kinds of elements belonging to Group VI of periodic table are sulfur and selenium.

16. A metal-organic chemical vapor-phase deposition process as claimed in claim 10, wherein, the two kinds of elements belonging to Group II of periodic table are zinc and magnesium, and the two kinds of elements belonging to Group VI of periodic table are sulfur and selenium.

17. A process for fabricating a light-emitting element including the steps of metal-organic chemical vapor-phase deposition as claimed in claim 1.

18. A process for fabricating a light-emitting element as claimed in claim 17, wherein, the layer of the compound semiconductor constituting the light-emitting element comprises a double heterostructure.

19. A process for fabricating a light-emitting element as claimed in claim 17, wherein, the layer of the compound semiconductor constituting the light-emitting element comprises a grated structure.

20. A process for fabricating a light-emitting element as claimed in claim 17, wherein, the layer of the compound semiconductor constituting the light-emitting element comprises a separate confinement heterostructure.

* * * * *